United States Patent
Schoellkopf

Patent Number: 6,166,607
Date of Patent: Dec. 26, 2000

[54] SEMICONDUCTOR TEST STRUCTURE FORMED IN CUTTING PATH OF SEMICONDUCTOR WATER

[75] Inventor: Jean-Pierre Schoellkopf, Grenoble, France

[73] Assignee: STMicroelectronics S.A., Gentilly, France

[21] Appl. No.: 09/264,150

[22] Filed: Mar. 5, 1999

[30] Foreign Application Priority Data

Mar. 5, 1998 [FR] France ................................. 98 02713

[51] Int. Cl.[7] ............................. H03B 5/00; G01R 31/28; H01L 21/66; H01L 27/04
[52] U.S. Cl. ............................. 331/57; 324/763; 324/765; 438/18
[58] Field of Search ............................. 331/57; 324/763, 324/765; 438/18

[56] References Cited

U.S. PATENT DOCUMENTS

| | | | |
|---|---|---|---|
| 5,059,899 | 10/1991 | Farnworth et al. | 438/18 |
| 5,266,890 | 11/1993 | Kumbasar et al. | 324/158.1 |
| 5,338,424 | 8/1994 | Drimer et al. | 204/298.11 |
| 5,640,097 | 6/1997 | Hada | 324/713 |

FOREIGN PATENT DOCUMENTS

| | | |
|---|---|---|
| 05/041429 | 2/1993 | Japan . |
| 10078474 | 3/1998 | Japan . |
| 1247583 | 9/1971 | United Kingdom . |

*Primary Examiner*—Siegfried H. Grimm
*Attorney, Agent, or Firm*—Theodore G. Galanthay; Stephen C. Bongini; Fleit, Kain, Gibbons, Gutman & Bongini P.L.

[57] ABSTRACT

A semiconductor test structure includes a semiconductor test device having at least one group of test cells that are connected in series and looped back so as to form an oscillator. Each test cell includes a base cell that is formed at least partially in the semiconductor substrate and an ancillary structure that is connected to at least one of the terminals of the base cell. Further, the ancillary structure is distributed over at least two metallization levels that are above the base cell, and is formed on each metallization level by first and second mutually entangled networks of metal tracks that are electrically arranged so as to form an at least capacitive ancillary structure.

25 Claims, 5 Drawing Sheets

SEMICONDUCTOR TEST STRUCTURE FORMED IN CUTTING PATH OF SEMICONDUCTOR WATER

CROSS-REFERENCE TO RELATED APPLICATIONS

This application is based upon and claims priority from prior French Patent Application No. 98-02713, filed Mar. 5, 1998, the entire disclosure of which is herein incorporated by reference.

BACKGROUND OF THE INVENTION

1. Field of the Invention

The present invention relates to semiconductor test structures, and more specifically to a semiconductor test structures that is formed in a cutting path of a semiconductor wafer.

2. Description of Related Art

Conventionally, a plurality of integrated circuits are formed in predetermined zones of a circular semiconductor wafer. The zones of the wafer are delimited by cutting paths along which the wafer is subsequently sliced to separate the individual integrated circuits. Before cutting the wafer and simultaneous with the formation of the integrated circuits, test structures are also formed in the silicon, typically in the vicinity of the cutting paths. Such test structures generally include chains of inverters having transistors of different widths and lengths associated with capacitive loads made from gate oxides, and each inverter cell is repeated so as to form an oscillating ring. The output frequency of the oscillating ring is divided to allow measurement at low frequency (e.g., 1 MHz). The frequency measurement allows monitoring of the characteristics of the transistors of the test structure, and thus allows indirect monitoring of the characteristics of the transistors of the integrated circuits adjacent to the test structure. Additionally, the test structures can be used to validate electrical simulation models. However, conventional test structures do not allow measurement of the influence of the interconnection resistances and capacitances that exist in the integrated circuits.

SUMMARY OF THE INVENTION

In view of these drawbacks, it is an object of the present invention to remove the above-mentioned drawbacks and to provide a test structure that allows the influence of the interconnection capacitances to be taken into account without increasing the area of the test structure.

Another object of the present invention is to provide a test structure that allows both the interconnection capacitances and interconnection resistances to be taken into account without increasing the area of the test structure.

One embodiment of the present invention provides a semiconductor test structure of the type formed in a cutting path of a semiconductor wafer. The test structure includes a semiconductor test device having at least one group of test cells that are connected in series and looped back so as to form an oscillator. Each of the test cells includes a base cell that is at least partially formed in the semiconductor substrate and an ancillary structure that is connected to at least one of the terminals of the base cell. Further, the ancillary structure is distributed over at least two metallization levels that are above the base cell, and is formed on each metallization level by first and second mutually entangled networks of metal tracks that are electrically arranged so as to form an at least capacitive ancillary structure.

According to a second embodiment of the present invention, on each metallization level the ancillary structure includes a first network of metal tracks connected to ground and a second network of metal tracks connected to only one of an input terminal and an output terminal of the base cell so as to form a capacitive ancillary structure.

According to a third embodiment of the present invention, on each metallization level the ancillary structure includes a first network of metal tracks connected to ground and a second network of metal tracks. Additionally, the ancillary structure includes interconnection vias that successively connect the output terminal of the base cell to the second network of the first metallization level of the ancillary structure, the second networks of two adjacent metallization levels, and the second network of the highest metallization level at the input terminal of the base cell of the following test cell. Thus, a continuous electrical pathway is formed between the output terminal of the base cell and the input terminal of the base cell of the following test cell. In this manner, a resistive and capacitive ancillary structure is formed.

A fourth embodiment of the present invention provides, a first test device that includes at least one oscillator formed solely of base cells and a second test device that includes at least one oscillator formed of base cells and capacitive ancillary structures. The test structures are arranged side by side in a cutting path of a semiconductor wafer. Similarly, another embodiment provides a first test device and a third test device that each include at least one oscillator formed of base cells and resistive and capacitive ancillary structures. The test devices are arranged side by side in the cutting path. In yet another embodiment, the first, second, and third test devices described above are arranged side by side in the cutting path.

In embodiments of the present invention, the entangling of the two networks (e.g., the imbricating of metal tracks connected to the output signal with metal tracks connected to ground) allows a fairly faithful representation of the influence of the interconnection capacitances existing on each metallization level of the integrated circuit to be obtained. Moreover, the use of at least two metallization levels in the ancillary structure allows the influence of the interconnection capacitances existing between two adjacent metallization levels to be taken into account. Further, because the ancillary structure is distributed above the base cell, no additional area is required and the ancillary structures can easily be formed using the upper metallization levels of the integrated circuits on the semiconductor wafer.

It is particularly advantageous to make the general orientation of the metal tracks of the two networks to be different from one metallization level to the next. In particular, if on each metallization level the metal tracks of the first and second networks of the ancillary structure form two mutually imbricated combs, the two combs of one metallization level should be offset by 90° with respect to the two combs of the immediately adjacent metallization level. This allows an even more faithful representation of the influence of the interconnection resistances and capacitances in the integrated circuits to be obtained.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 1:
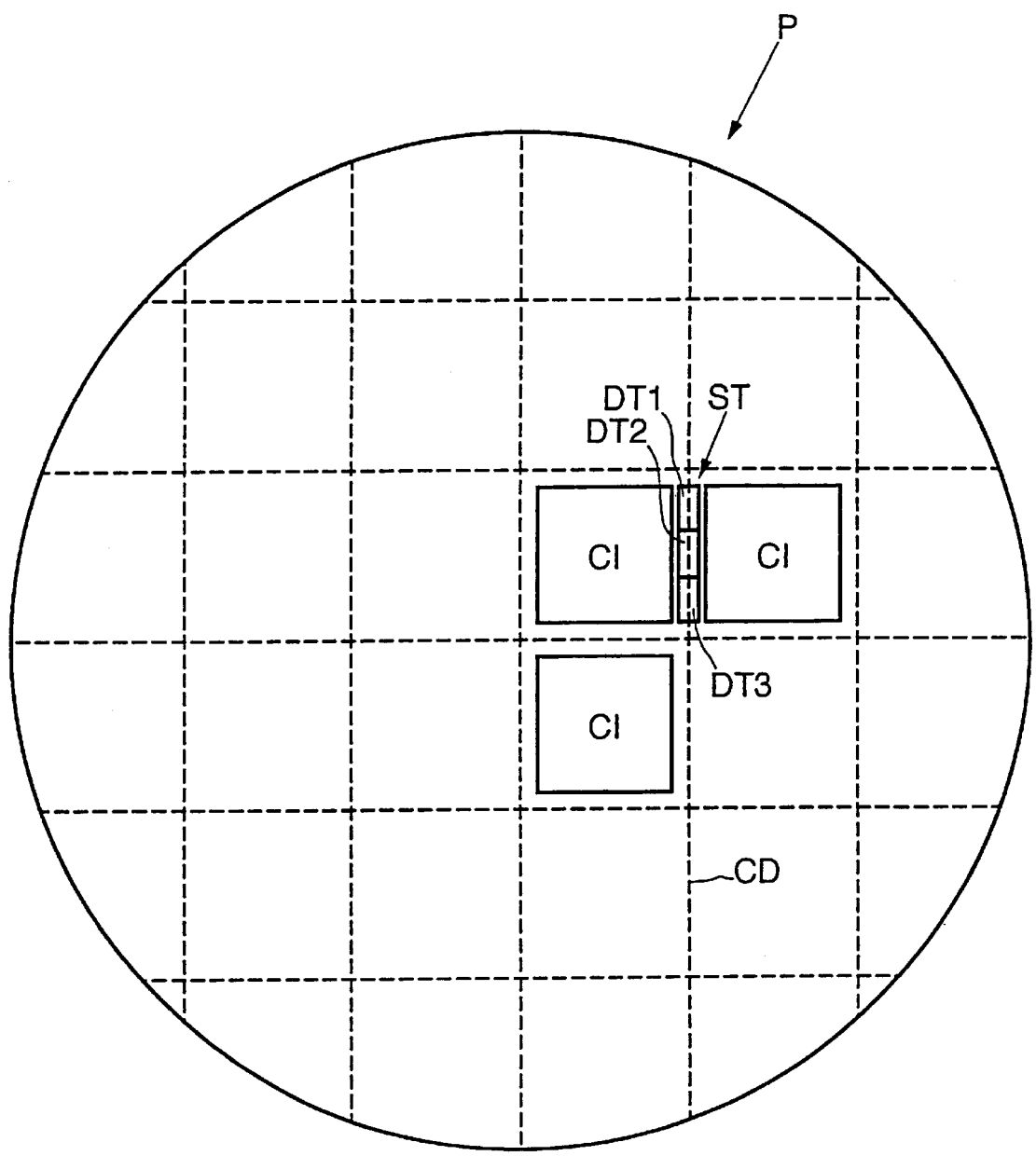
FIG. 1 is a block diagram of a semiconductor wafer having tests structures according to an embodiment of the present invention formed in cutting paths.

A semiconductor wafer having tests structures according to an embodiment of the present invention is shown in FIG. 1. A circular semiconductor (e.g., silicon) wafer P has zones on which integrated circuits CI are formed, and the zones are separated from one another by cutting paths CD. Test structures ST are formed in the silicon in the cutting paths CD. In the exemplary embodiment of FIG. 1, the test structure ST includes three test devices DT1, DT2, and DT3 that are arranged side by side. The circuit configuration of these three test devices will now be explained with reference to FIGS. 2 through 4.

Figure 2:
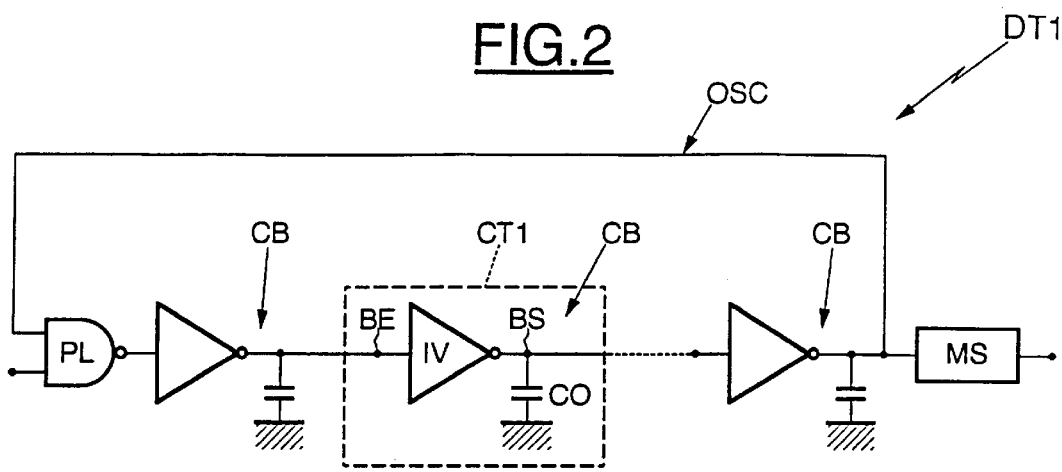
FIG. 2 is a block diagram of a semiconductor test device composed solely of conventional base cells.

As shown in FIG. 2, the first test device DT1 includes a group (e.g., six) of base cells CB that are connected in series. The base cells CB of the group are looped back through a logic gate PL so as to form an oscillating ring OSC having an oscillation frequency, and a frequency divider MS is provided to aid in the measurement of the oscillation frequency. Each base cell CB of the first test device DT1 has an inverter IV that is formed conventionally by complementary transistors and connected between an input terminal BE and an output terminal BS. Associated with the inverter IV is an additional capacitance CO that is made from gate oxides and connected between the output terminal and ground. The dimensions (i.e., width and length) of the channels of the complementary transistors and the values of the additional capacitances CO can vary from one base cell to another, and the number of base cells can vary from one oscillating ring to another. For example, one test structure can have rings with 56 cells, while other rings may have 16 cells, or 90 cells or 74 cells.

Figure 3:
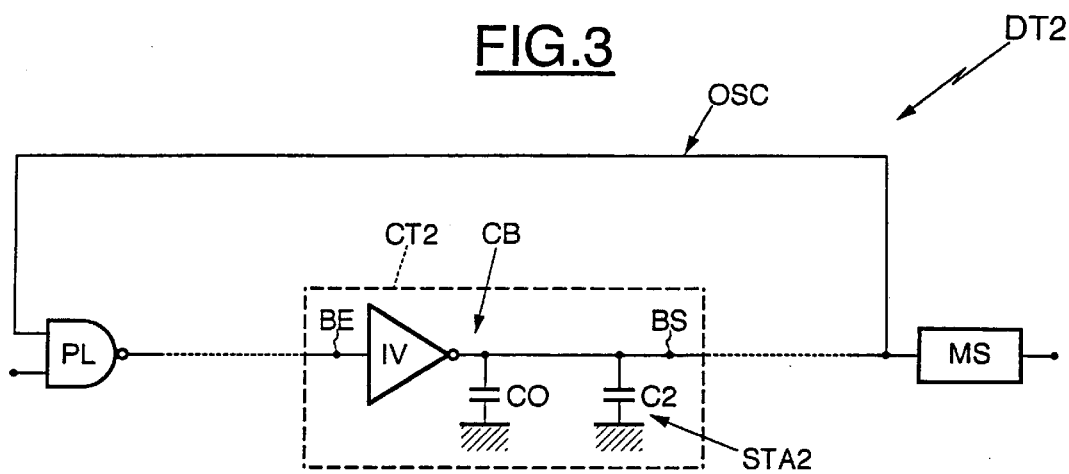
FIG. 3 is a block diagram of a semiconductor test device having test cells with capacitive ancillary structures.

In order to allow measurement of the influence of the interconnection capacitances, the first test device DT1 is "enhanced" to produce the second test device DT2 as shown in FIG. 3. The difference between the first test device DT1 and the second test device DT2 is in the architecture of the test cells CT that are connected in series and looped back to form the oscillating ring OSC. For simplicity, a single test cell CT2 is shown in FIG. 3. The test cell CT2 of the second test device DT2 includes the base cell CB and a capacitive ancillary structure STA2 that is connected to the output terminal BS of the cell CT2.

Figure 4:
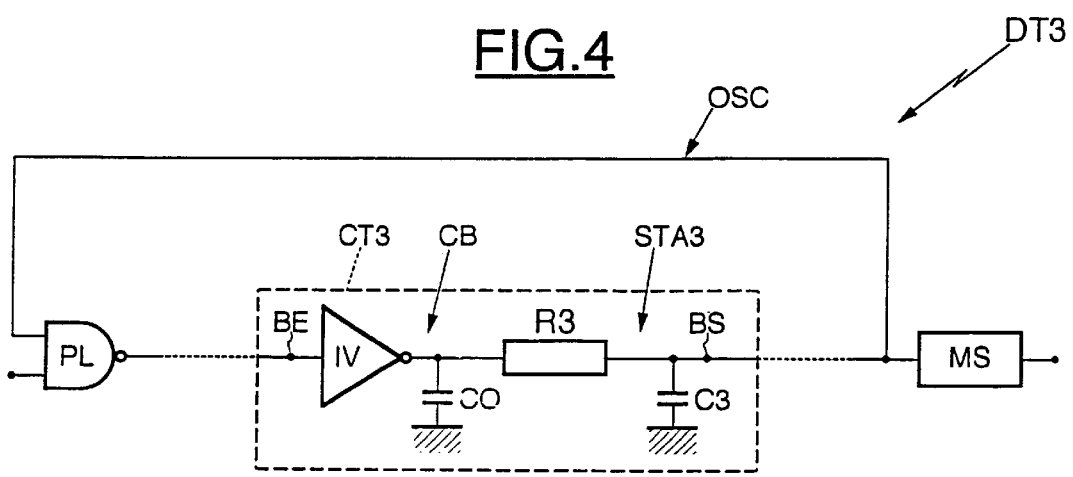
FIG. 4 is a block diagram of a semiconductor test device having test cells equipped with resistive and capacitive ancillary structures in accordance with an embodiment of the present invention.

Likewise, to allow measurement of the influence of the interconnection resistances and capacitances, the first test device DT1 is "enhanced" to produce the third test device DT3 as shown in FIG. 4. Once again for simplicity, only one test cell CT3 is shown for the oscillating ring OSC of FIG. 4. The test cell CT3 of the third test device DT3 includes the base cell CB and a resistive/capacitive ancillary structure STA3 that is connected between the output terminal of the base cell CB and the output terminal BS of the test cell CT3 (i.e., the input terminal of the base cell of the next test cell in the chain).

Figure 5:
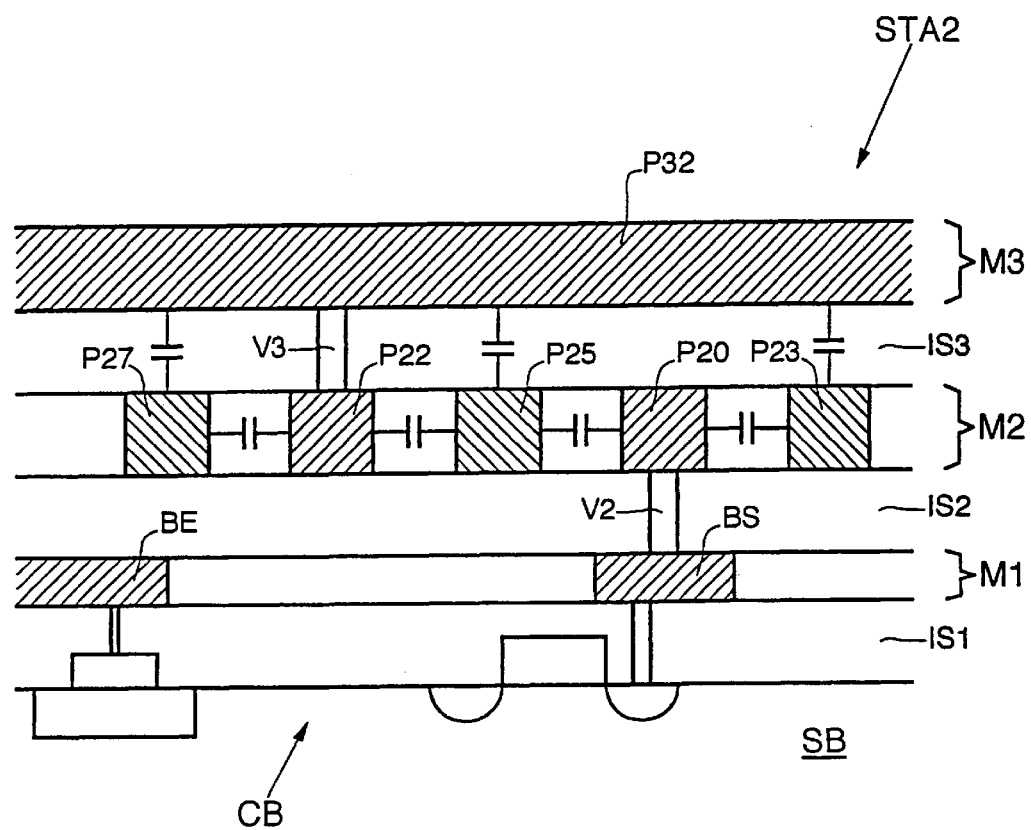
FIGS. 5 and 6 are more detailed diagrams of the arrangement of the metal tracks of a capacitive-type ancillary structure in accordance with the present invention.
Figure 6:
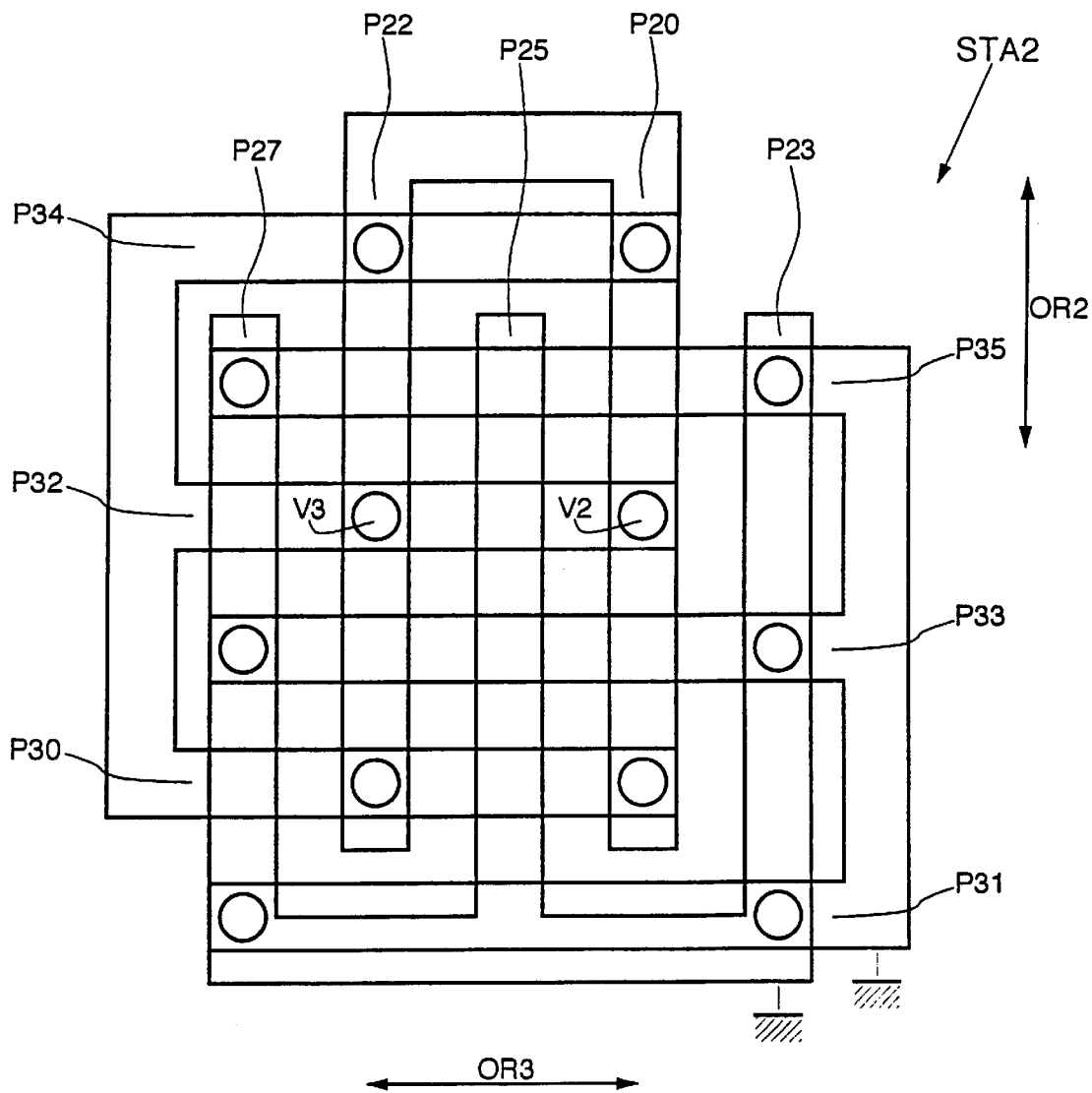

A layout of metal tracks for forming a capacitive ancillary structure is shown in the FIGS. 5 and 6. In this exemplary embodiment, the metal tracks are distributed over two metallization levels M2 and M3 for simplicity. However, in further embodiments, the networks of metal tracks for the capacitive ancillary structure can be distributed over three or more metallization levels (e.g., up to the fifth metallization level). In the device of FIG. 5, a portion of metal track at the first metallization level M1 forms the input terminal BE of the base cell CB that is formed in the semiconductor substrate SB. In particular, the input portion BE of metal track electrically contacts (e.g., through a via in the insulating layer IS1) a polysilicon gate region of the base cell. Further, another portion of metal track at the first metallization level M1 forms the output terminal BS of the base cell CB and is connected (e.g., through another via) to one of the active zones (i.e., the drain or source) of a transistor of the base cell.

At the second metallization level M2, the capacitive ancillary structure STA2 is formed by a first network of metal tracks P20 and P22 that are connected together to form a first comb extending in a first direction OR2, and a second network of metal tracks P23, P25, and P27 that are connected together to form a second comb extending in the same direction OR2. In this embodiment, the first and second combs are mutually imbricated (i.e., each metal track of the first comb is situated between two metal tracks of the second comb). In a conventional manner, these metal tracks P20, P22, P23, P25, and P27 are separated from one another by a material with a low dielectric constant, and the second metallization level M2 is separated from the first and third metallization levels M1 and M3 by two insulators IS2 and IS3 formed of a material with a higher dielectric constant.

The metal tracks P20 and P22 of the first comb are electrically connected to the output terminal BS of the base cell through a via V2, and the metal tracks P23, P25, and P27 of the second comb are electrically connected to ground in a conventional manner (e.g., by one or more vias that connect one of these tracks to a ground contact, not shown for simplicity). At the immediately higher metallization level M3, the capacitive ancillary structure STA2 includes a third comb formed by three metal tracks P30, P32, and P34 that extend in a second direction OR3, which is perpendicular to the first direction OR2.

The metal tracks P30, P32, and P34 of the third comb are electrically connected to the output terminal BS of the base cell through a via V3 that connects one track P32 at the third metallization layer M3 to one track P22 at the second metallization layer. The mutual interconnection of the two combs can also be produced through other vias, as shown in FIG. 6. Additionally, at the third metallization level M3, there is a fourth comb formed by three metal tracks P31, P33, and P35 extending in the second direction OR3 that are mutually imbricated with the tracks P30, P32, and P34 of the third comb. The metal tracks P31, P33, and P35 of the fourth comb are electrically connected to ground (e.g., through vias connected to the tracks of the second comb of the second metallization level M2).

In the presence of an applied voltage, the capacitive ancillary structure STA2 behaves like a capacitor C2 connected to the output terminal BS of the base cell. The capacitor C2 is formed by the various coupling capacitances between the various tracks of one metallization level and by the coupling capacitances between tracks of the two adjacent metallization levels. If a 0.25 micron technology is used, the planar dimensions of such an ancillary structure can be made on the order of 20×3 microns, and the distance between two adjacent metal tracks is on the order of 0.4 microns. Thus, the ancillary structure can be easily positioned above the location of the base cell.

Figure 7:
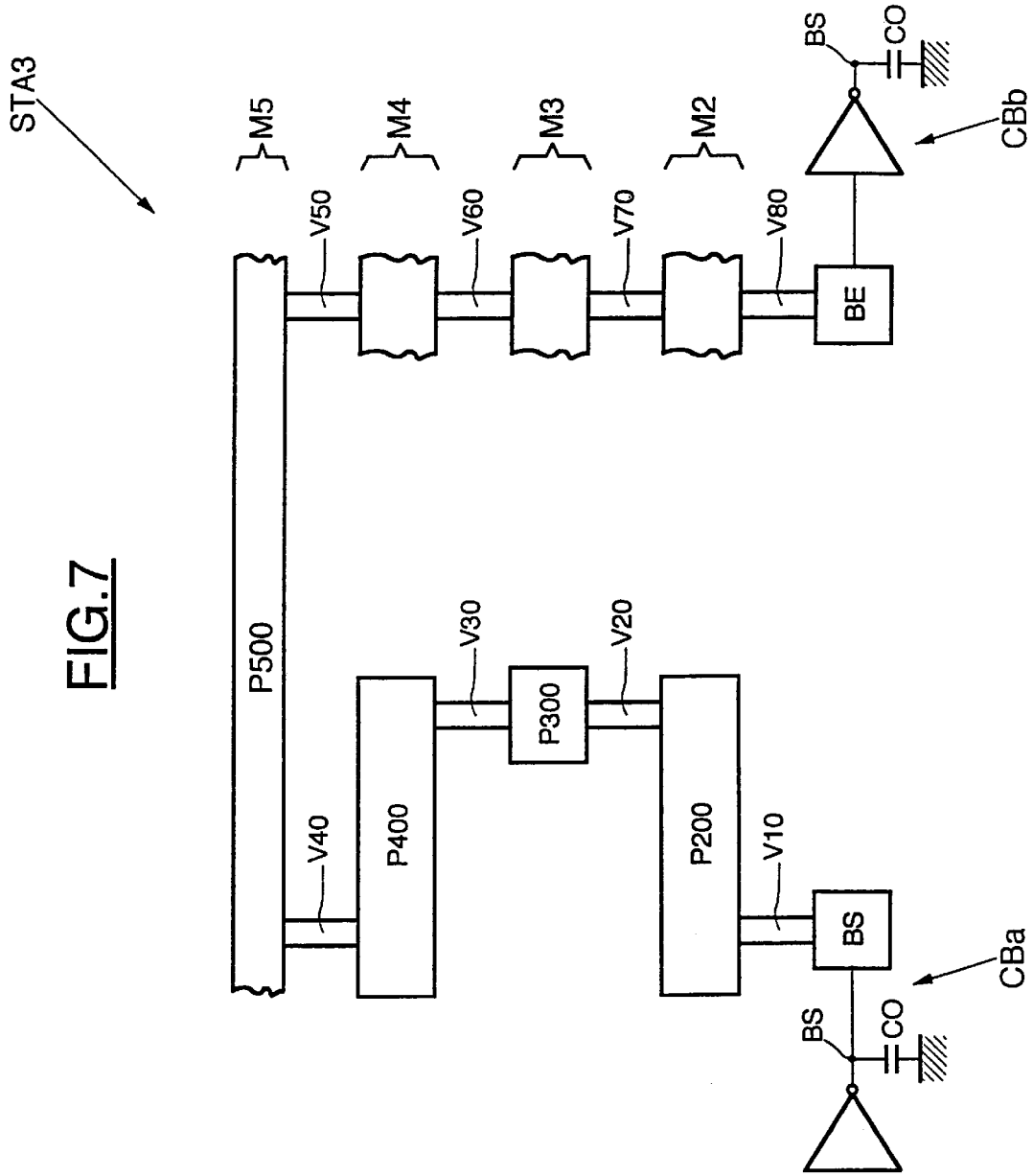
FIG. 7 is a diagram showing the organization of metal tracks of a resistivelcapacitive-type ancillary structure in accordance with an embodiment of the present invention.

FIG. 7 shows a resistive/capacitive ancillary structure. As shown, the structure includes a continuous electrical pathway between the output terminal BS of one base cell CBa of the chain and the input terminal BE of the next base cell CBb of the chain. More specifically, the continuous electrical pathway is formed by metal tracks P200, P300, P400, and P500 at the second through fifth metallization levels M2, M3, M4, and M5 that form pathways (e.g., as mazes) on each of these metallization levels. These metal tracks are connected in series through a group of interconnection vias V10, V20, V30, V40, V50, V60, V70 and V80 so as to make an continuous electrical pathway from the output terminal BS of the one base cell to the input terminal BE of the next base cell.

Furthermore, on each metallization level, there are provided metal tracks connected to ground and imbricated between those metal tracks that convey the electrical signal. These networks of metal tracks are distributed over the metallization levels and have general orientations that advantageously vary from one metallization level to another in a manner similar to that described above with reference to FIG. 6. Additionally, such networks are advantageously representative of the interconnection capacitances within one metallization level and between the various metallization levels on the one hand, and of the interconnection resistances, especially at the level of the vias, on the other hand. When a voltage is applied, the ancillary structure of FIG. 7 behaves like a resistive/capacitive network R3-C3 that is connected between the two base cells.

A test phase that uses the three test devices DT1, DT2, and DT3 described above will now be described. A voltage VDD is applied and the total current I0 and the output frequency F0 are measured at an oscillating ring such as the first of the first test device DT1. The voltage VDD is also applied to the analogous oscillating ring of the second test device DT2 (i.e., the first ring), and the total current I2 and the output frequency F2 are measured for that ring (the frequency F2 being obviously lower than the frequency F0 due to the added capacitive load). By neglecting the short-circuit currents (which are small as compared with the currents I2 and I0), the value of the total additional capacitance C20 is then obtained through the following formula.

$$C20=[I2/F2-I0/F0]/VDD$$

Then, the measured capacitive value for each capacitive ancillary structure STA2 is obtained by dividing the value for the total capacitance C20 by the number of test cells CT2. This measured capacitive value can then be fed into an electrical simulation model (e.g., "spice simulation") to obtain simulated frequencies F0 and F2 that can be compared with the measured frequencies F0 and F2 in order to validate the electrical simulation model. Additionally, the measured capacitive value can be compared with the value obtained using extraction tools (e.g., "design kit tools") for calculating capacitive values from design diagrams in order to validate the extraction tools.

When the third test device DT3 is used, the output frequency F3 is also measured at the oscillating ring that is analogous to that used in the first test device DT1 (i.e., the first ring). Once again, the output frequency F2 is obviously lower than the frequency F0 due to the added capacitive load. Then, a formula similar to the above formula in which the current I2 and the frequency F2 are replaced by the measured current I3 and the measured frequency F3 yields the total additional capacitance, and this is divided by the number of test cells CT3 to obtain the measured capacitive value of each ancillary structure STA3. This measured capacitive value can be fed into an electrical simulation model and the value of the resistance R3 adjusted within the model until the resultant simulated frequencies F0 and F3 are identical to the measured frequencies F0 and F3.

The value of the resistance R3 obtained in this manner can be compared with the resistance value obtained from an extraction tool in order to validate the extraction tool. Thus, if it is assumed that the various electrical simulation models and extraction tools have been validated, the simulated theoretical output frequencies can be determined for each of the second and third test devices DT2 and DT3. Then, The testing devices can be tested in isolation (i.e., without making any comparison with values arising from the first testing device DT1) in order to verify the simulated values.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, embodiments of the present invention may not include all of the features described above. Therefore, it is intended that the present invention not be limited to the particular embodiments disclosed, but that the invention include all embodiments falling within the scope of the appended claims.

What is claimed is:

1. In a semiconductor test structure of the type formed in a cutting path of a semiconductor substrate wafer, a semiconductor test device comprising:
    at least one group of test cells that are connected in series and looped back so as to form an oscillator, each of the test cells including:
        a base cell formed at least partially in the semiconductor substrate, the base cell including a set of terminals; and
        an ancillary structure connected to at least one of the terminals of the base cell,
        wherein the ancillary structure is distributed over at least first and second metallization levels that are above the base cell, and is formed on each of the metallization levels by first and second mutually entangled networks of metal tracks that are electrically arranged so as to form an at least capacitive ancillary structure.

2. The semiconductor test device as defined in claim 1, wherein on each of the metallization levels, the first network of metal tracks of the ancillary structure is connected to ground and the second network of metal tracks of the ancillary structure is connected to only one of an input terminal and an output terminal of the base cell, so as to form a capacitive ancillary structure.

3. The semiconductor test device as defined in claim 2, wherein the first and second networks of metal tracks of the first metallization level form two mutually imbricated combs.

4. The semiconductor test device as defined in claim 3, wherein the first and second networks of metal tracks of the second metallization level form two mutually imbricated combs.

5. The semiconductor test device as defined in claim 2, wherein the general orientation of the first network of the first metallization level is different than the general orientation of the first network of the second metallization level.

6. The semiconductor test device as defined in claim 1,
wherein on each of the metallization levels, the first network of metal tracks of the ancillary structure is electrically connected to ground, and
the ancillary structure includes interconnection vias that successively connect an output terminal of the base cell, the second network of the first metallization level of the ancillary structure, the second network of the second metallization level of the ancillary structure, the second network of a third metallization level of the ancillary structure, and the second network of a fourth metallization level.

7. The semiconductor test device as defined in claim 6, wherein the second network of the fourth metallization level is electrically connected to an input terminal of the base cell of the next test cell so as to form a resistive and capacitive ancillary structure that has a continuous electrical pathway between the output terminal of the base cell and the input terminal of the base cell of the next test cell.

8. The semiconductor test device as defined in claim 6, wherein the first and second networks of metal tracks of the first metallization level form two mutually imbricated combs.

9. An oscillator comprising a plurality of test cells that are connected in series and looped back, at least one of the test cells comprising:
a base cell having an input terminal and an output terminal; and
an ancillary structure connected to at least one of the input terminal and the output terminal of the base cell,
wherein the ancillary structure is distributed over at least first and second metallization levels, and
the ancillary structure is formed on each of the metallization levels by first and second mutually entangled networks of metal tracks that are electrically arranged so as to form a capacitive ancillary structure.

10. The oscillator as defined in claim 9, wherein the base cell includes an inverter.

11. The oscillator as defined in claim 9, wherein the first and second metallization levels are above the base cell.

12. The oscillator as defined in claim 9, wherein on each of the metallization levels, the first network of metal tracks of the ancillary structure is electrically connected to a ground terminal and the second network of metal tracks of the ancillary structure is electrically connected to only one of the input terminal and the output terminal of the base cell, so as to form a capacitive ancillary structure.

13. The oscillator as defined in claim 12,
wherein the first and second networks of metal tracks of the first metallization level form two mutually imbricated combs, and
the first and second networks of metal tracks of the second metallization level form two mutually imbricated combs.

14. The oscillator as defined in claim 12, wherein the general orientation of the first network of the first metallization level is different than the general orientation of the first network of the second metallization level.

15. The oscillator as defined in claim 9,
wherein on each of the metallization levels, the first network of metal tracks of the ancillary structure is electrically connected to a ground terminal, and
the ancillary structure includes interconnection vias that successively connect the output terminal of the base cell of the at least one test cell, the second network of the first metallization level of the ancillary structure, the second network of the second metallization level of the ancillary structure, the second network of a third metallization level of the ancillary structure, and the second network of a fourth metallization level.

16. The oscillator as defined in claim 15, wherein the second network of the fourth metallization level is electrically connected to an input terminal of the base cell of a test cell following the at least one test cell, so as to form a resistive and capacitive ancillary structure that has a continuous electrical pathway between the output terminal of the base cell of the at least one test cell and the input terminal of the base cell of the test cell following the at least one test cell.

17. The oscillator as defined in claim 15, wherein the first and second networks of metal tracks of the first metallization level form two mutually imbricated combs.

18. A semiconductor test structure comprising:
a first test device having at least one oscillator formed solely of base cells; and
a second test device having at least one oscillator formed of at least one group of test cells that are connected in series and looped back so as to form an oscillator, each of the test cells including:
a base cell formed at least partially in the semiconductor substrate; and
an ancillary structure connected to at least one of the terminals of the base cell,
wherein the ancillary structure is distributed over at least first and second metallization levels that are above the base cell, and is formed on each of the metallization levels by first and second mutually entangled networks of metal tracks that are electrically arranged so as to form an at least capacitive ancillary structure.

19. The semiconductor test structure as defined in claim 18, wherein on each of the metallization levels, the first network of metal tracks of the ancillary structure is electrically connected to ground and the second network of metal tracks of the ancillary structure is electrically connected to only one of an input terminal and an output terminal of the base cell, so as to form a capacitive ancillary structure.

20. The semiconductor test structure as defined in claim 19,
wherein the first and second networks of metal tracks of the first metallization level form two mutually imbricated combs, and
the first and second networks of metal tracks of the second metallization level form two mutually imbricated combs.

21. The semiconductor test structure as defined in claim 19, wherein the general orientation of the first network of the first metallization level is different than the general orientation of the first network of the second metallization level.

22. The semiconductor test structure as defined in claim 19, further comprising a third test device having at least one oscillator formed of at least one group of test cells that are connected in series and looped back so as to form an oscillator, each of the test cells of the third test device including:

a base cell formed at least partially in the semiconductor substrate; and an ancillary structure connected to at least one of the terminals of the base cell, wherein the ancillary structure is distributed over at least first and second metallization levels that are above the base cell, and is formed on each of the metallization levels by first and second mutually entangled networks of metal tracks that are electrically arranged so as to form an at least capacitive ancillary structure, on each of the metallization levels, the first network of metal tracks of the ancillary structure is electrically connected to ground, and the ancillary structure includes interconnection vias that successively connect an output terminal of the base cell, the second network of the first metallization level of the ancillary structure, the second network of the second metallization level of the ancillary structure, the second network of a third metallization level of the ancillary structure, and the second network of a fourth metallization level.

23. A semiconductor test structure comprising:

a first test device having at least one oscillator formed solely of base cells; and a second test device having at least one oscillator formed of at least one group of test cells that are connected in series and looped back so as to form an oscillator, each of the test cells including:

a base cell formed at least partially in the semiconductor substrate; and an ancillary structure connected to at least one of the terminals of the base cell, wherein the ancillary structure is distributed over at least first and second metallization levels that are above the base cell, and is formed on each of the metallization levels by first and second mutually entangled networks of metal tracks that are electrically arranged so as to form an at least capacitive ancillary structure, on each of the metallization levels, the first network of metal tracks of the ancillary structure is electrically connected to ground, and the ancillary structure includes interconnection vias that successively connect an output terminal of the base cell, the second network of the first metallization level of the ancillary structure, the second network of the second metallization level of the ancillary structure, the second network of a third metallization level of the ancillary structure, and the second network of a fourth metallization level.

24. The semiconductor test structure as defined in claim 23, wherein the second network of the fourth metallization level is electrically connected to an input terminal of the base cell of the next test cell so as to form a resistive and capacitive ancillary structure that has a continuous electrical pathway between the output terminal of the base cell and the input terminal of the base cell of the next test cell.

25. The semiconductor test structure as defined in claim 23, wherein the first and second networks of metal tracks of the first metallization level form two mutually imbricated combs.

* * * * *

UNITED STATES PATENT AND TRADEMARK OFFICE
CERTIFICATE OF CORRECTION

PATENT NO.    : 6,166,607
DATED         : December 26, 2000
INVENTOR(S)   : Jean-Pierre Schoellkopf It is certified that error appears in the above-identified patent and that said Letters Patent is hereby corrected as shown below:

Please change the Title of Invention from "SEMICONDUCTOR TEST STRUCTURE FORMED IN CUTTING PATH OF SEMICONDUCTOR WATER" to -- SEMICONDUCTOR TEST STRUCTURE FORMED IN CUTTING PATH OF SEMICONDUCTOR WAFER --

Under Attorney, Agent or Firm, please change "Theodore G. Galanthay" to -- Theodore E. Galanthay --

Signed and Sealed this

Second Day of October, 2001

*Attest:*

NICHOLAS P. GODICI
*Attesting Officer*   *Acting Director of the United States Patent and Trademark Office*